United States Patent
Engel et al.

(10) Patent No.: US 7,403,083 B2
(45) Date of Patent: Jul. 22, 2008

(54) MULTIPLE RESONANCE FILTER

(75) Inventors: Günter Engel, Leibnitz (AT); Thomas Feichtinger, Graz (AT); Markus Ortner, Graz (AT); Reinhard Sperlich, Kolbermoor (DE)

(73) Assignee: EPCOS AG, Munich (DE)

( * ) Notice: Subject to any disclaimer, the term of this patent is extended or adjusted under 35 U.S.C. 154(b) by 190 days.

(21) Appl. No.: 10/526,687

(22) PCT Filed: Sep. 9, 2003

(86) PCT No.: PCT/DE03/02986

§ 371 (c)(1),
(2), (4) Date: Nov. 8, 2005

(87) PCT Pub. No.: WO2004/025831

PCT Pub. Date: Mar. 25, 2004

(65) Prior Publication Data

US 2006/0104002 A1     May 18, 2006

(30) Foreign Application Priority Data

Sep. 9, 2002   (DE) ............................... 102 41 674

(51) Int. Cl.
*H03H 7/01* (2006.01)

(52) U.S. Cl. .................... 333/185; 361/301.4; 361/328

(58) Field of Classification Search ............. 361/306.3, 361/312, 321.2, 301.4, 328; 333/185
See application file for complete search history.

(56) References Cited

U.S. PATENT DOCUMENTS

| 3,617,834 | A | * | 11/1971 | Rayburn ................. 361/321.2 |
| 4,729,058 | A | * | 3/1988 | Gupta et al. ............. 361/321.3 |
| 4,947,286 | A | * | 8/1990 | Kaneko et al. .......... 361/321.2 |
| 5,172,299 | A | * | 12/1992 | Yamada et al. .......... 361/321.2 |
| 5,274,346 | A | | 12/1993 | Izu et al. |
| 5,428,499 | A | | 6/1995 | Szerlip et al. |
| 5,657,199 | A | * | 8/1997 | Devoe et al. ................. 361/328 |
| 5,898,562 | A | | 4/1999 | Cain et al. |
| 6,058,004 | A | | 5/2000 | Duva et al. |
| 6,088,214 | A | | 7/2000 | Malone et al. |
| 6,304,156 | B1 | | 10/2001 | Ishizaki et al. |
| 6,850,404 | B2 | | 2/2005 | Engel et al. |
| 2004/0114305 | A1 | | 6/2004 | Gunter et al. |

FOREIGN PATENT DOCUMENTS

| DE | 100 64 447 | | 1/2003 |
| EP | 1 079 520 | | 2/2001 |
| EP | 1 215 748 | | 6/2002 |
| JP | 07161576 A | * | 6/1995 |
| JP | 07201634 A | * | 8/1995 |

* cited by examiner

*Primary Examiner*—Benny Lee
*Assistant Examiner*—Eric R Hamill
(74) *Attorney, Agent, or Firm*—Fish & Richardson P.C.

(57) ABSTRACT

A multiple resonance filter includes at least three multilayer capacitors having at least two different capacitances. The at least three multilayer capacitors are adjacent each other. Two of the at least three multilayer capacitors have a same capacitance. The two capacitors with the same capacitance are on outer ends of an arrangement formed by the at least three multilayer capacitors.

13 Claims, 9 Drawing Sheets

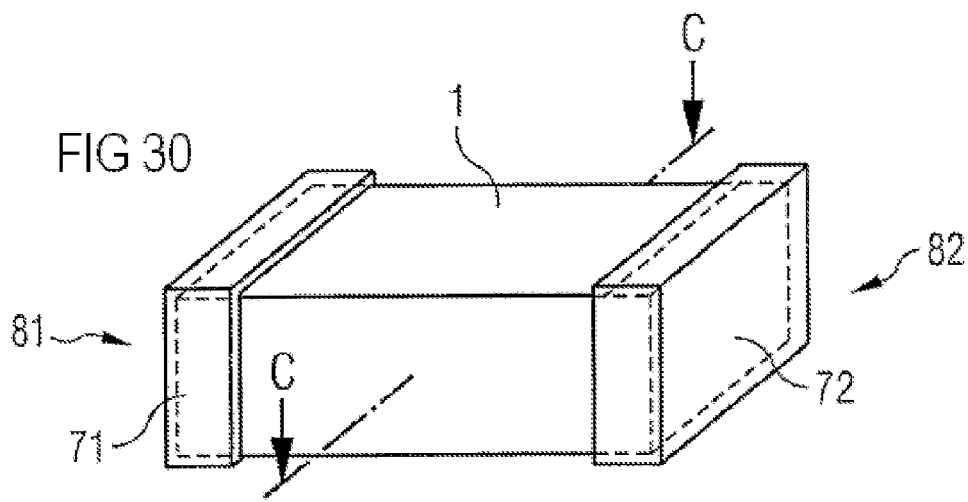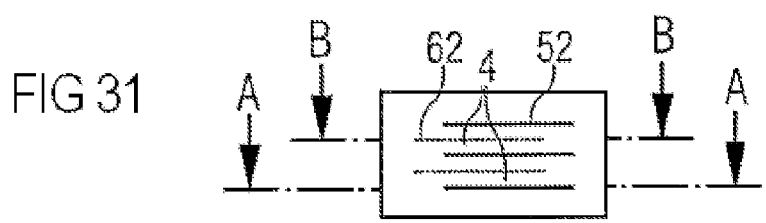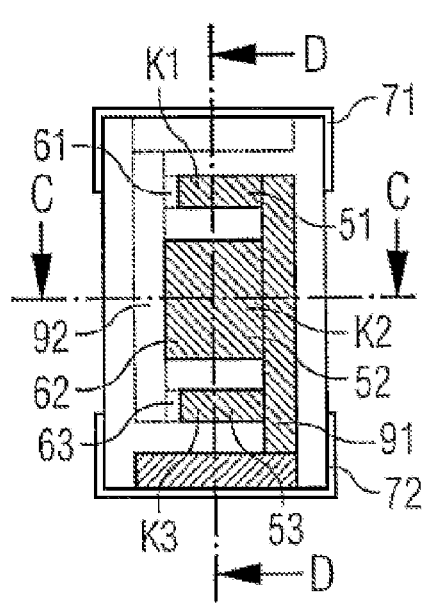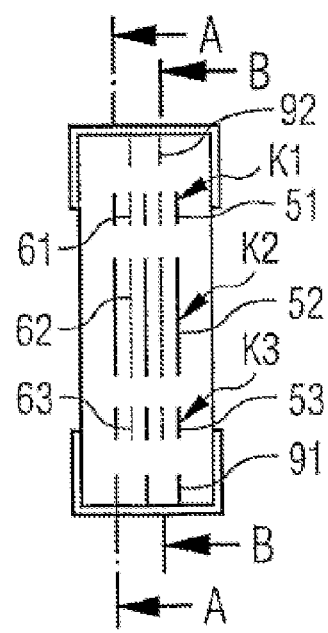

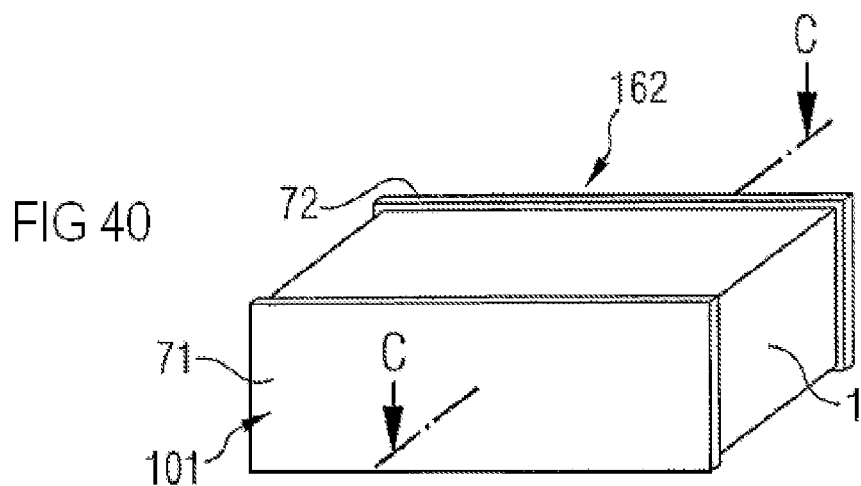
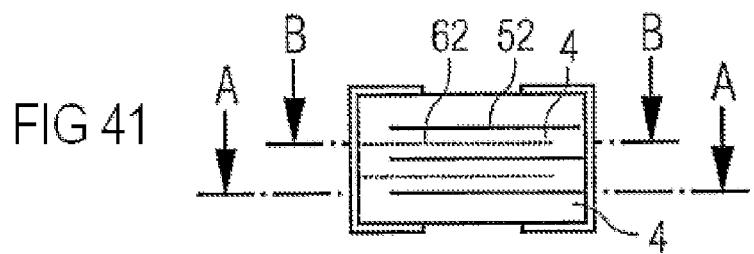
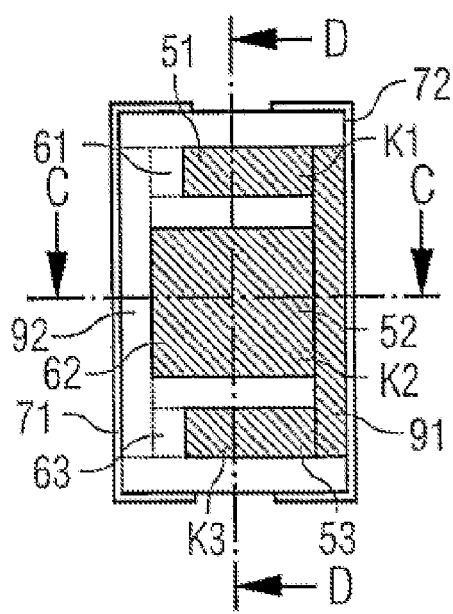
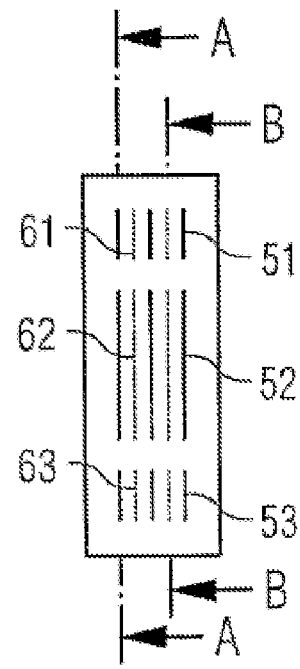

MULTIPLE RESONANCE FILTER

TECHNICAL FIELD

This patent application relates to a multiple resonance filter that contains a plurality of multilayer capacitors.

BACKGROUND

In a multiple resonance filter known from U.S. Pat. No. 5,898,562, two adjacent multilayer capacitors of differing capacitance are integrated in a multilayer component. This component is used for the attenuation of two frequencies determined by the capacitances of the two capacitors. The disadvantage of the known art component is that the values for attenuation are relatively poor.

SUMMARY

For the foregoing reason, one goal of the present invention is to disclose a multiple resonance filter that has good attenuation values.

A multiple resonance filter is disclosed that is an electronic multilayer component. It contains at least three multilayer capacitors, which are arranged adjacent to one another. The multilayer capacitors have, in this case, at least two capacitances differing from one another. Of the multilayer capacitors positioned in a row, the two outer ones have this capacitance.

As a result of the structure of the multiple resonance filter with capacitors arranged adjacent to one another in a row, and as a result of forming of capacitors with the same capacitance at two edges of the row, it is possible to achieve decoupling of the electromagnetic fields in the filter. This decoupling results in improvement of the attenuation behavior at the individual resonant frequencies.

The foregoing characteristics result in an advantage of the multiple resonance filter, namely its improved attenuation behavior.

In an advantageous embodiment of the multiple resonance filter, the multilayer capacitors are connected in parallel to one another. As a result of the parallel connection, the filter characteristics of the multiple resonance filter can be improved even further.

In an embodiment of the multilayer component, a basic element is provided that has a stack of dielectric layers, in which the dielectric layers are placed on top of one another. Electrode layers are arranged between the dielectric layers. One advantage of this embodiment is that the technology of multilayer capacitors, which in itself is well known, can be used to implement the multiple resonance filter.

Multilayer capacitors are generally structured in such a way that electrode stacks, which interlock in a comb-like manner, are formed in the interior of the component by internal electrode layers. Each stack of electrode layers is jointly connected to an external contact.

In an embodiment of the multiple resonance filter, external contacts of the electrode layers are arranged on the front faces of the basic element.

In another embodiment of the multiple resonance filter, electrode layers associated with different capacitors are connected with one another in the interior of the basic element. As a result, a parallel connection of the individual capacitors results in the interior of the basic element, i.e., in the interior of the component.

In an embodiment of the multiple resonance filter, electrode layers progress in the longitudinal direction of the basic element. In another embodiment, electrode layers progress normal to the longitudinal direction of the basic element.

In an embodiment of the multiple resonance filter, external contacts of the electrode layers are arranged on side faces of the basic element. This embodiment of the filter makes it possible to assign the external contacts individually to each individual capacitor of the multilayer component. This embodiment of the filter makes it possible to carry out the desired switching of the capacitors among one another only on the printed circuit board to be assembled with the component. This increases the flexibility of application options for the component.

In particular, the foregoing makes it possible to connect the multilayer capacitors in parallel to one another outside the basic element.

In an embodiment of the filter, three multilayer capacitors are provided. In another embodiment of the filter, four multilayer capacitors are provided. The two middle multilayer capacitors have the same capacitance.

In an embodiment of the filter, the multilayer capacitors, together with the inductors of the electrode layers or together with the inductors of the leads to the electrode layers, form LC filters. As a result of the addition of inductors to the component, the filter characteristics of the component can be increased further. Because the principal contribution of the inductors needed for the filter originates in the leads and the electrode layers, it is possible to adjust the inductance through suitable design of the electrode layers and/or the leads to the electrode layers to a desired degree.

In an embodiment of the filter, the dielectric layers contain capacitor ceramics that are based on barium titanate. For example, a dielectric layer made of so-called "COG" ceramics is possible. Such a material would include, e.g., (Ba, Sm) NdTiO$_6$ ceramics. However, an "X7R" ceramic, such as doped barium titanate, would also be possible.

In another embodiment, the dielectric layers contain a capacitor material having a varistor effect.

A possible ceramic material with a varistor effect would be ZnO—Bi— or ZnO—Pr— based ceramic material. The advantage of such dielectric layers is that, in addition to the capacitor, they also integrate a varistor, as an additional component, into the capacitor.

It is also possible to combine capacitor ceramics and ceramics having a varistor effect within a single component.

In an embodiment of the filter, the basic element has a surface area smaller than 6 mm$^2$. One advantage of this embodiment is that the space requirements of the component are very small, which is advantageous for miniaturized circuits.

In an embodiment of the filter, electrode layers associated with the two outer multilayer capacitors have identical surface areas. One advantage of this embodiment is that the need for identical capacitances of the external multilayer capacitors can be met easily via the identical surface areas.

In the following, the invention is explained in greater detail on the basis of exemplary embodiments and the corresponding figures:

DESCRIPTION OF THE DRAWINGS

FIG. 30 shows, as an example, another multiple resonance filter in an exterior perspective view, wherein the exterior view encompasses more options for the inner structure.

FIGS. 31, 31A, 31D show, as an example, the internal structure for a component having an external structure in accordance with FIG. 30.

FIG. 40 shows an example of the external structure for a filter, this structure being applicable for filters whose internal structure is shown in FIGS. 41, 41A and 41D, as well as in FIGS. 42, 42A and 42D.

FIGS. 41, 41A, 41D show the internal structure for an embodiment of the filter, the external structure of which is given by FIG. 40.

DETAILED DESCRIPTION

Figure 1:
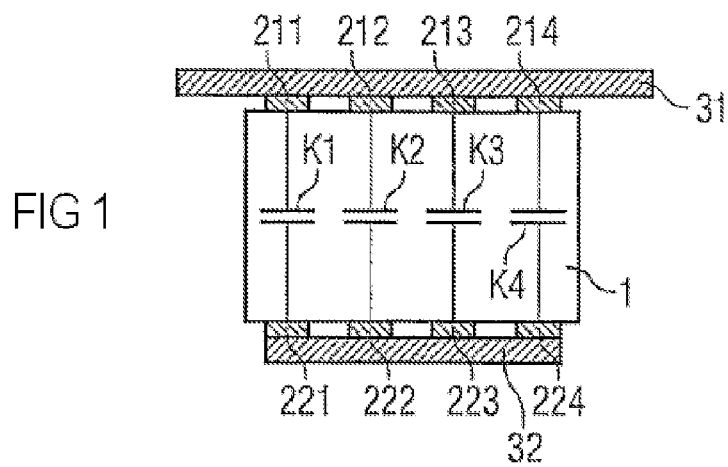
FIG. 1 shows a multiple resonance filter in schematic cross-section.

FIG. 1 shows a multiple resonance filter that has a basic element 1. In the interior of the basic element 1, capacitors K1, K2, K3, K4 are arranged adjacent to another in a row. Each of the capacitors K1, K2, K3, K4 is connected with a first capacitor connector 211, 212, 213, 214 and with a second capacitor connector 221, 222, 223, 224. The first capacitor connectors 211, 212, 213, 214, each for a capacitor K1, K2, K3, K4, are connected with one another in an electrically conductive manner by a contact 32. A parallel circuit of the capacitors K1, K2, K3, K4 is implemented via contacts 31, 32. With respect to their capacitance C1, C2, C3, the capacitors K1, K2, K3, K4 are designed so that the capacitors K1 and K4 have capacitance C1, meaning that they are identical in capacitance. The capacitors K2 and K3 have capacitances C2 and C3. Capacitances C2, C3 can be identical or different from one another.

Figure 2:
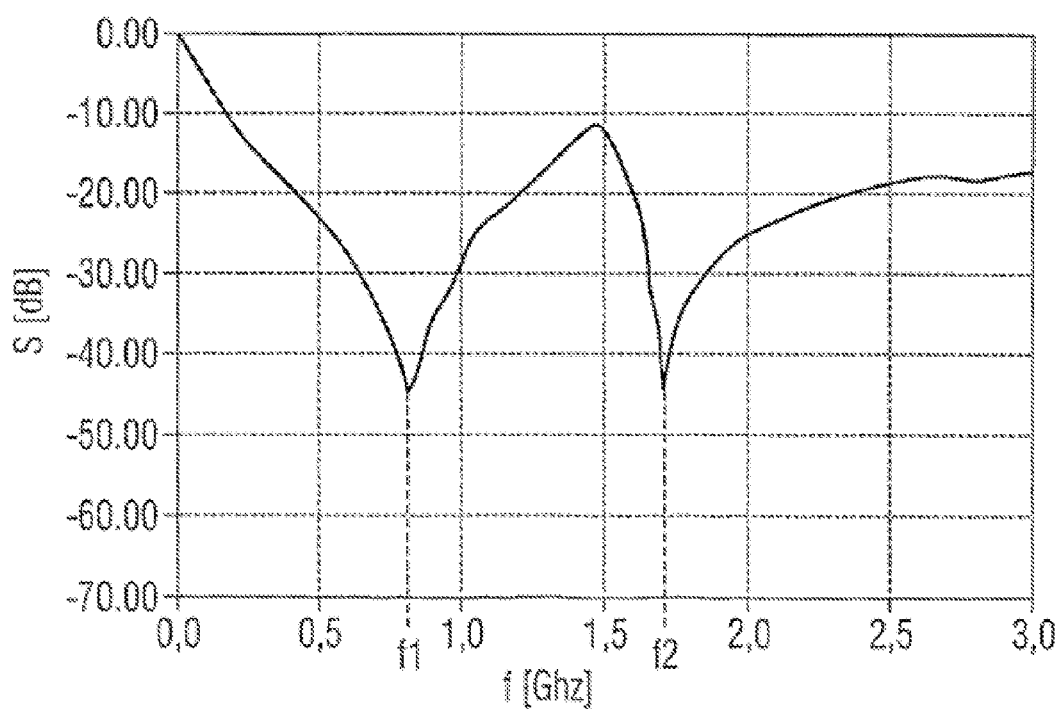
FIG. 2 shows the insertion attenuation of the component from FIG. 1.

FIG. 2 shows the attenuation behavior of the multiple resonance filter from FIG. 1 in the case in which the two capacitors K2 and K3 from FIG. 1 have the same capacitance C2. In FIG. 2, the attenuation S, in decibel units, is plotted over the frequency f, measured in GH, of an electric signal that was applied to the filter. It is evident, in FIG. 2, that a very high attenuation of less than −40 dB was measured at resonant frequencies f1 and f2. This shows that the multiple resonance filter described in this application has very good attenuation characteristics. In this case, the two resonant frequencies f1, f2 at which the minima appear in the attenuation curve are due to the capacitances C1 and C2 of the capacitors K1, K2, K3, K4.

FIG. 30 shows the external structure of a multiple resonance filter, in which the external contacts 71, 72 are arranged on the front faces of the basic element 1 in cap form. The advantage of the cap-formed arrangement of the external contacts 71, 72 is that the component is suitable for the surface mounted design. In this case, the external contact 71 is applied to the front face 81 of the basic element and the external contact 72 to the front side 82 of the basic element 1.

FIG. 31 shows a section along line C-C from FIG. 30. The dielectric layers 4 placed on top of one another, which are separated from one another by electrode layers 52, 62, are visible. Because, in the example of FIG. 31, the contacting of the electrode layers 52, 62 occurs through the front faces of the basic element, the electrode layers 52, 62 are not drawn out to the outer lateral edge of the basic element in FIG. 31. The electrode layers 52, in this case for a multilayer capacitor, are all switched in parallel to one another. The electrode layers 62, which, for their part, are placed on top of one another in the same manner as the electrode layers 52, also belong to the same multilayer capacitor as the electrode layers 52, and are arranged to be laterally offset relative to the electrode layers 52. The comb-like interlocking of the electrode layers 52 and 62 also follows from FIG. 31. In FIG. 31, the electrode layers 52 are identified by continuous lines, whereas each of the electrode layers 62 is identified by a dotted line. This applies by analogy to FIGS. 31D, 32, 32D, 33, 33D, 34, 34D, 41, 41D, 42, 42D, 51, 51D, 52 and 52D.

The multilayer capacitors described here are all fundamentally structured as shown in FIG. 31. This applies, in particular, to the comb-like interlocking of the electrode layers.

FIG. 31A shows a section along line A-A from FIG. 31. It is evident that three multilayer capacitors K1, K2, K3 are arranged in the interior of the multilayer component. The two outer capacitors K1, K3 comprise, in this case, electrode layers 51, 53 and 61, 63, respectively, which have the same surface area. For this reason, the capacitors K1 and K3 have the same capacitance. In contrast, the multilayer capacitor K2, which is arranged in the center of the row of capacitors K1, K2, K3, comprises electrode layers 52, 62, which are larger than the electrode layers 51, 61, 53, 63. Accordingly, the capacitor K2 has a greater capacitance than capacitors K1 and K3. In FIG. 31A, the electrodes placed in the section plane are depicted as hatched areas delimited by continuous lines. Electrode layers arranged in a plane located above or below this level, which, in particular, are the electrode layers 61, 62, 63, as well as the inner connecting element 92, are depicted by areas delimited by dashed lines. FIG. 31A shows that the electrode layers 51, 52, 53 are connected with one another by an inner connecting element 91. The inner connecting element 91 can be formed in the same manner as the electrode layers 51, 52, 53. For example, it can be constructed of a metalliferous paste in multilayer technique.

The connecting element 91 is contacted directly with the external contact 72. Accordingly, there is an inner connecting element 92 for electrode layers 61, 62, 63, said connecting element connecting these electrode layers 61, 62, 63 with one another in an electrically conductive manner. The inner connecting element 92 is connected with the external contact 71 in an electrically conductive manner. This achieves internal parallel connection of the capacitors K1, K2, K3.

FIG. 31D shows a section along line D-D from FIG. 31A. In a depiction analogous to that shown in FIG. 31, it can be seen that for each capacitor there are electrode layers 51, 52, 53 placed on top of one another (identified by continuous lines for the first contact of the capacitors) and/or electrode layers 61, 62, 63 placed on top of one another (identified by dashed lines for the second contact of the capacitors). The electrode layers 51, 52 as well as 52, 62 and 53, 63, which are placed on top of one another, each form a multilayer capacitor K1, K2, K3. The connecting elements 92, 93 are also shown in FIG. 31D. It should be noted, in this regard, that, in the depiction shown in FIG. 31D, the connecting elements 91, 92 are depicted in a plurality as stacks of connecting elements 91, 92 placed on top of one another.

Figure 32:
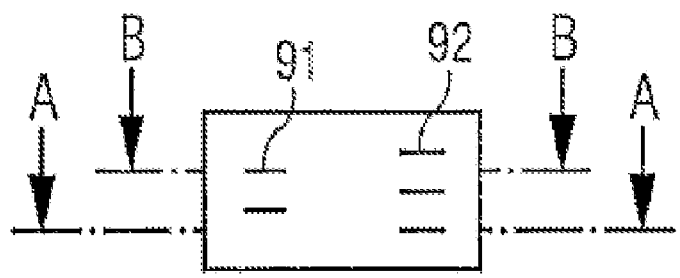
FIGS. 32, 32A, 32D show the internal structure of another filter, the external structure of which is shown in FIG. 30.
Figure 32A:
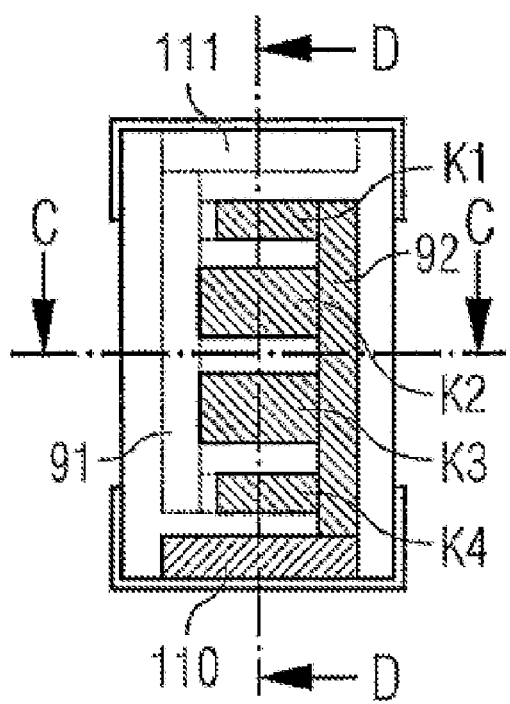

FIG. 32 shows the inner structure of a multiple resonance filter corresponding to FIG. 31, the difference being that only the inner connecting elements 91, 92 are shown. The inner connecting elements 91 are depicted as dashed lines. The inner connecting elements 92 are depicted as continuous lines. FIG. 32A shows a section along line A-A from FIG. 32. In analogy to FIG. 31A, it can be seen that the multiple resonance filter consists of four capacitors K1, K2, K3, K4, which are structured in a manner analogous to FIG. 31A, FIG. 31D and FIG. 31. The only difference between FIGS. 32, 32A and 32D and FIG. 31, FIG. 31A and FIG. 31D lies in the number of capacitors. A lead 110 or a lead 111 is also shown in FIG. 32A, from which it follows that inductors can be integrated into the component using the leads 110, 111. In this case, the inductors are determined by means of the length of the leads 110, 111. The function of the leads 110, 111, in this case, is that of the inner connecting elements 91, 92. It should be noted, in this regard, that the inductors of the component also depend on the shapes and surface areas of the electrode layers 51, 52, 53, 54 and/or 61, 62, 63, 64, as they are depicted in a top view in FIG. 32A and in cross-section in FIG. 32D.

Figure 32D:
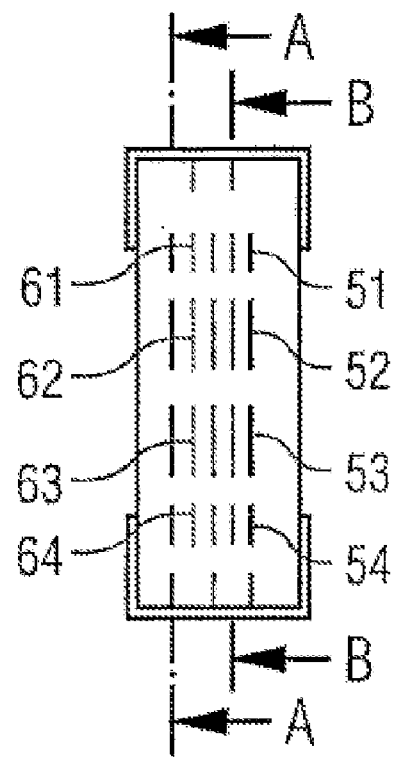

FIG. 32D shows a section along line D-D from FIG. 32A. Once again, four electrode layers 51, 62 or 52, 62 or 53, 63 and 54, 64, which are placed on top of one another, are shown. The structure is again depicted in analogy to the structure of FIG. 31D.

Figure 33:
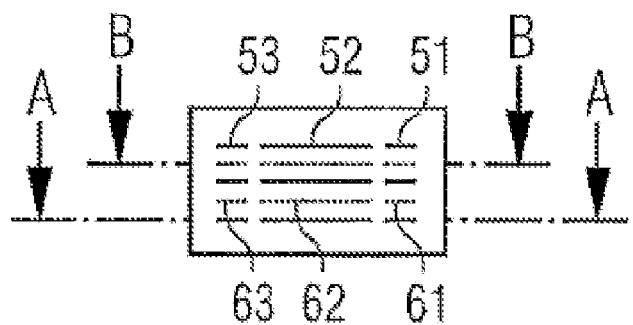
FIGS. 33, 33a, 33D show, by way of example, an internal structure of another component, the external structure of which is shown in FIG. 30.
Figure 33A:
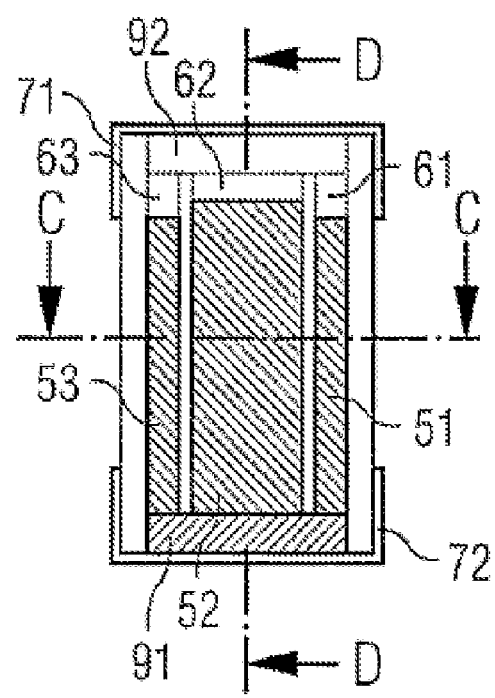
Figure 33D:
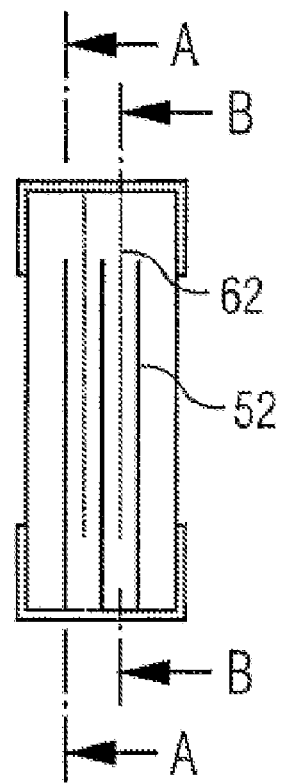

FIGS. 33, 33A and 33D show a multiple resonance filter corresponding to FIGS. 31, 31A, 31D or corresponding to FIGS. 32, 32A, 32D, the difference being that the electrode layers 51, 52, 53 or 61, 62, 63 in the exemplary embodiment shown in FIGS. 33, 33A, 33D do not progress at right angles to the longitudinal direction of the basic element but rather in this longitudinal direction. The length of the inner connecting element 91, 92 is shortened accordingly, whereas the length of the electrode layers 51, 52, 53 or 61, 62, 63 is enlarged. The various exemplary embodiments with regard to the orientation of the electrode layers 51, 52, 53, 54 or 61, 62, 63, 64 show that a great deal of latitude exists with respect to the design of the capacitors and/or inductors for the multiple resonance filter. Otherwise, the depiction shown in FIGS. 33, 33A, 33D corresponds to the examples from FIGS. 31, 31A, 31D.

Figure 34:
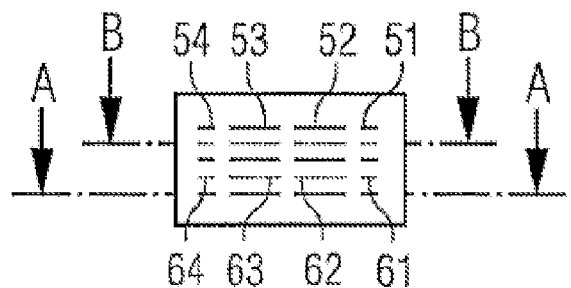
FIGS. 34, 34a, 34D show, by way of example, the internal structure of another filter, the external structure of which is given by FIG. 30.
Figure 34A:
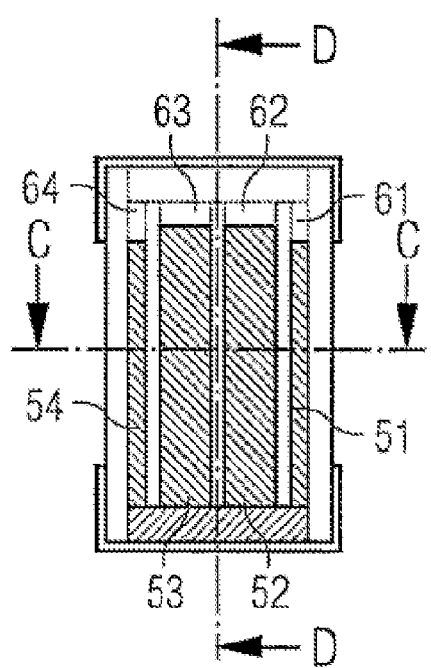
Figure 34D:
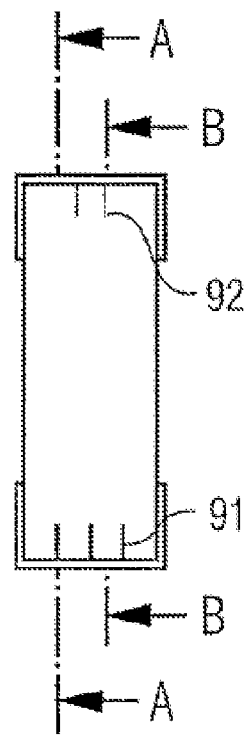

FIGS. 34, 34A, 34D show an embodiment of the multiple resonance filter corresponding to FIGS. 33, 33A, 33D. The difference is that four instead of three multilayer capacitors are formed in the component.

FIG. 40 shows an external structure for a group of multiple resonance filters. Embodiments for the inner structure are shown, as examples for this group, in FIGS. 41, 41A, 41D as well as 42, 42A, 42D. FIG. 40 shows the multiple resonance filter with the basic element 1. External contacts 71, 72 are arranged on its lateral surfaces 101, 102.

FIG. 41 shows a section along line C-C from FIG. 40. In analogy to the depiction shown in FIGS. 31, 32, 33, 34, stacks of dielectric layers 4 and electrode layers 52, 62, which are placed on top of one another, are shown. The views of the multiple resonance filter shown in FIGS. 41, 41A and 41D only differ from the depiction in FIGS. 31, 31A, 31D in that the capacitors are contacted from the side face of the basic element rather than from the front faces of the basic element. Accordingly, the length of the leads 110, 111 is shortened, in FIGS. 41, 41A, 41D, for example, which is why the inductivity of the component is reduced in this embodiment. Each of FIGS. 41A, 41D shows sectional views that correspond, in analogous fashion, to FIGS. 31A, 31D.

Figure 42:
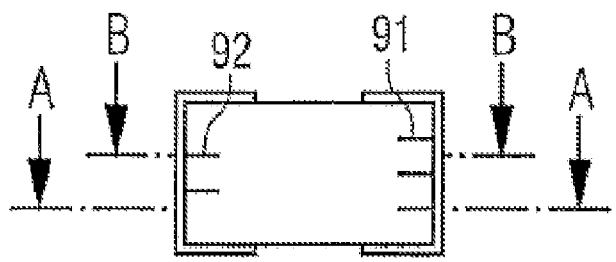
FIGS. 42, 42A, 42D show the internal structure for another filter, the external structure of which is given by FIG. 40.
Figure 42A:
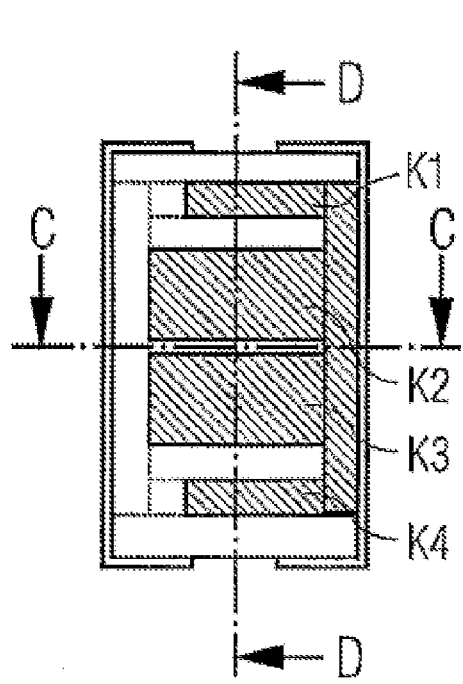
Figure 42D:
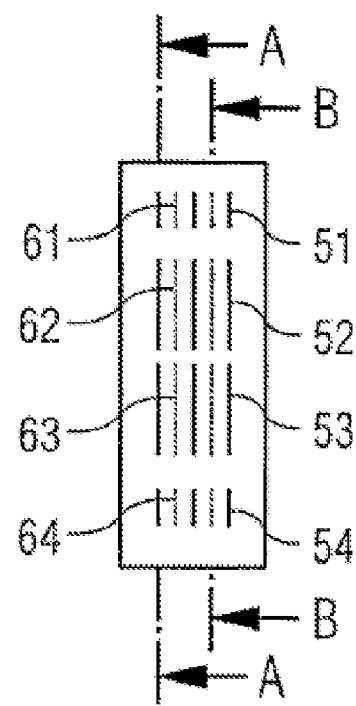

FIGS. 42, 42A, 42D show an embodiment of the multiple resonance filter corresponding to FIGS. 41, 41A, 41D. The difference in this embodiment is that four capacitors K1, K2, K3, K4 instead of three capacitors is formed in the interior of the component. Otherwise, the depictions in FIGS. 42, 42A, 42D correspond to the depictions in FIGS. 41, 41A, 41D.

Figure 50:
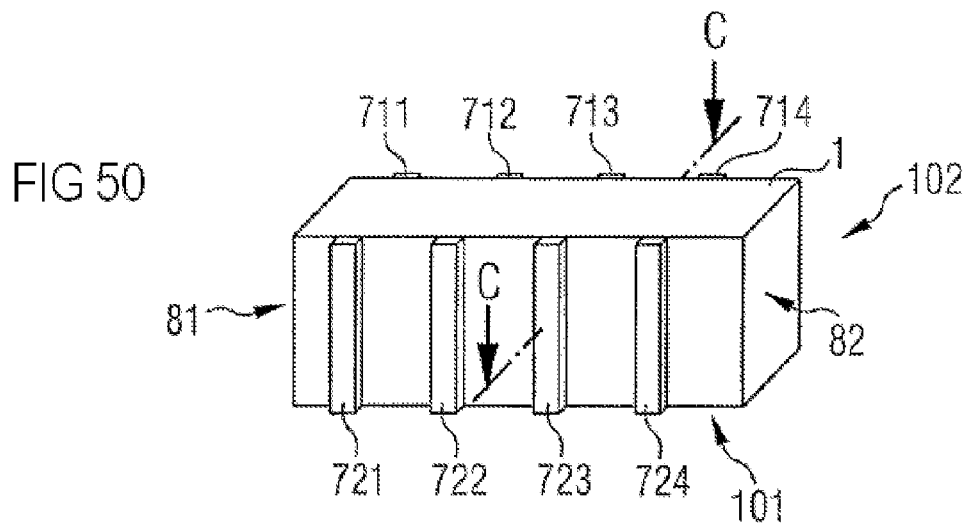
FIG. 50 shows an example of the external structure of a filter in a perspective view, the external structure being applicable for a plurality of internal structures.

FIG. 50 shows an external structure for a multiple resonance filter, in which one basic element is provided. The basic element 1 has front faces 81, 82. The basic element 1 also has side faces 101, 102. Four external contacts 711, 712, 713, 714 or 721, 722, 723, 724 are arranged on each side face 101. In this case, each opposing pair of external contacts 711, 712, 713, 714 or 721, 722, 723, 724 belongs to a capacitor in the interior of the basic element 1.

Figure 51:
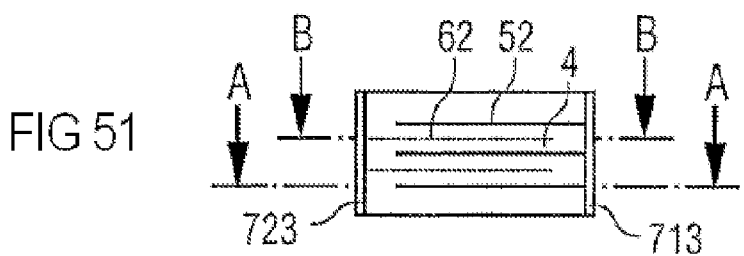
FIGS. 51, 51A, 51D show the internal structure of a filter, the external structure of which is given by FIG. 50.
Figure 51A:
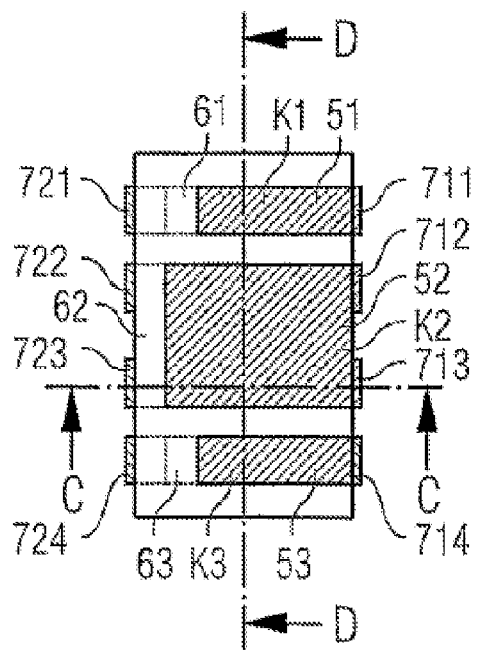
Figure 51D:
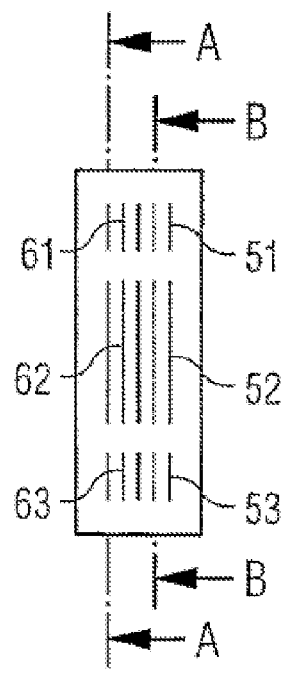

FIG. 51 shows a section along line C-C from FIG. 50. The depiction in FIGS. 51, 51A, 51D corresponds to the depiction in FIGS. 41, 41A, 41D. The difference is that the connecting elements 91, 92 are absent here because each individual capacitor K1, K2, K3 is individually connected with external contacts 711, 712, 713, 714 or 721, 722, 723, 724 (see FIG. 51A). Otherwise, the depiction in FIGS. 51, 51A, 51D corresponds to the depiction in FIGS. 41, 41A, 41D.

Figure 52:
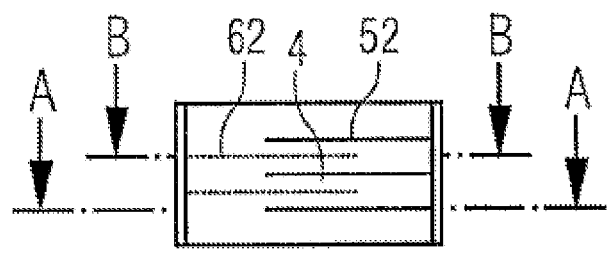
FIGS. 52, 52A, 52D show the internal structure of another filter, the external structure of which is given by FIG. 50.
Figure 52A:
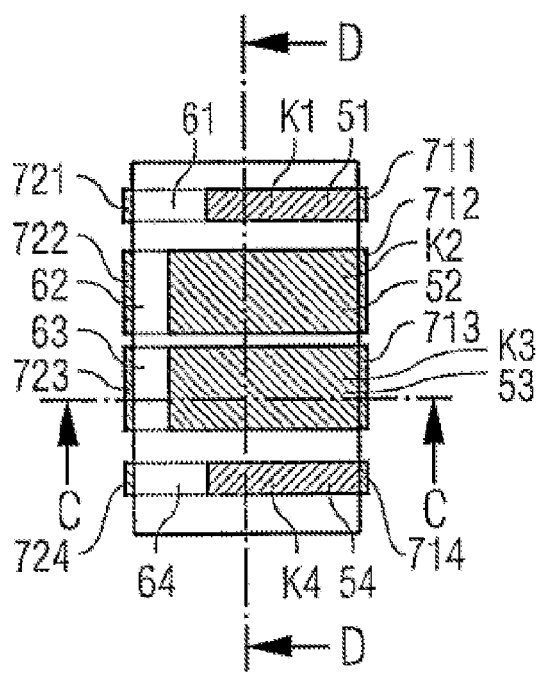
Figure 52D:
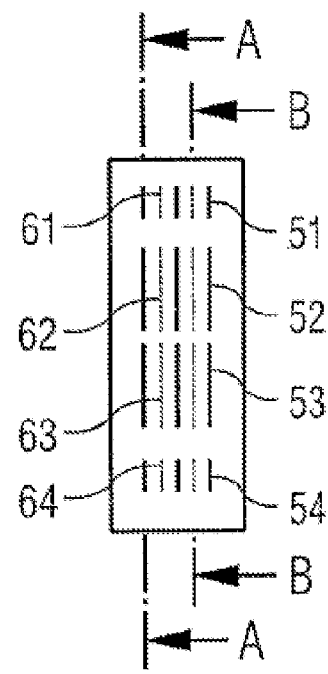

FIGS. 52, 52A, 52D show the inner structure of a multiple resonance filter as it can be formed having an external structure corresponding to FIG. 50. The depiction in FIGS. 52, 52A, 52D corresponds to the depiction in FIGS. 51, 51A, 51D, the difference being that four capacitors K1, K2, K3, K4 instead of three capacitors K1, K2, K3 are arranged along the component. Because the two center capacitors K2, K3 can be designed, with respect to their electrode layers 52, 53 or 62, 63, to have the same capacitance C2, the attenuation behavior at the second resonant frequency f2 can be significantly improved once again.

The invention is not limited to multiple resonance filters having two filter frequencies, but can be applied to multiple resonance filters having a plurality of different resonant frequencies.

The invention claimed is:

1. A resonance filter, comprising:
   at least three multilayer capacitors having at least two different capacitances, the at least three multilayer capacitors being adjacent to each other;
   wherein two capacitors of the at least three multilayer capacitors have a same capacitance, the two capacitors being on outer ends of an arrangement formed by the at least three multilayer capacitors;
   wherein the at least three electrode multilayer capacitors comprise a stack of dielectric layers; and electrode layers in the stack, the dielectric layers and the electrode layers forming a component;
   wherein external contacts on faces of the component correspond to electrode layers in the component;
   wherein the capacitors, the inductance of the electrode layers and of the external contacts, from LC filters.

2. The filter of claim 1, wherein the at least three multilayer capacitors are connected in parallel.

3. The filter of claim 1, further comprising:
   a connector element to connect electrode layers of different ones of the at least three multilayer capacitors, the connector element being inside the component.

4. The filter of claim 1, wherein the component has a length and a width, the length being greater than the width; and
   wherein electrode layers for different ones of the at least three multilayer capacitors are arranged substantially in parallel lengthwise in the component.

5. The filter of claim 1, wherein the component has a length and a width, the length being greater than the width; and wherein electrode layers for different ones of the at least three multilayer capacitors are arranged substantially in parallel widthwise in the component.

6. The filter of claim 1, further comprising:
a connector element that is external to the component and that connects the at least three multilayer capacitors in parallel.

7. The filter of claim 1, wherein the at least three multilayer capacitors comprise only three multilayer capacitors.

8. The filter of claim 1, wherein the at least three multilayer capacitors comprise four multilayer capacitors, the four multilayer capacitors being in a parallel arrangement, the four multilayer capacitors comprising two center capacitors located between the two edge capacitors on the outer ends in the parallel arrangement, the two center capacitors having a same capacitance.

9. The filter of claim 1, further comprising:
leads that interconnect the at least three multilayer capacitors; and
inductors connected to the leads.

10. The filter of claim 1, wherein the dielectric layers comprise barium titanate-based ceramics.

11. The filter of claim 1, wherein the electrode layers comprise a ceramic material having a varistor effect.

12. The filter of claim 1, wherein a cross-section of the component has a surface area that is less than 6 mm$^2$.

13. The filter of claim 1, wherein electrode layers for the two capacitors have surface areas that are substantially the same.

* * * * *

UNITED STATES PATENT AND TRADEMARK OFFICE
CERTIFICATE OF CORRECTION

PATENT NO. : 7,403,083 B2
APPLICATION NO. : 10/526687
DATED : July 22, 2008
INVENTOR(S) : Günter Engel Page 1 of 1

It is certified that error appears in the above-identified patent and that said Letters Patent is hereby corrected as shown below:

Column 6, Line 53:

Delete "from" and Insert -- form --

Signed and Sealed this

Twenty-eighth Day of October, 2008

JON W. DUDAS
*Director of the United States Patent and Trademark Office*